United States Patent [19]

Broadt et al.

[11] 4,326,241

[45] Apr. 20, 1982

[54] MULTILAMP PHOTOFLASH UNIT

[75] Inventors: David R. Broadt, Lewisburg; Donald W. Hartman; John W. Shaffer, both of Williamsport, all of Pa.; Emery G. Audesse, Beverly, Mass.

[73] Assignee: GTE Products Corporation, Stamford, Conn.

[21] Appl. No.: 181,936

[22] Filed: Aug. 27, 1980

[51] Int. Cl.$^3$ ............................................. G03B 15/02
[52] U.S. Cl. ........................................ 362/11; 362/15; 362/16
[58] Field of Search ....................... 362/3, 5, 11, 13, 14, 362/15, 16, 185, 189, 196, 198, 200, 213, 240, 278, 310, 320; 206/418, 419, 420, 476; 53/559; 354/143; 431/359

[56] References Cited

U.S. PATENT DOCUMENTS

| 3,454,756 | 7/1969 | Iwata et al. | 362/13 |
| 3,473,880 | 10/1969 | Wick | 362/13 |
| 3,512,332 | 5/1970 | Klein | 53/559 |
| 3,857,667 | 12/1974 | Vetere et al. | 362/11 |
| 3,920,371 | 11/1975 | Faller | 53/559 |

Primary Examiner—Donald P. Walsh
Attorney, Agent, or Firm—Edward J. Coleman

[57] ABSTRACT

A photoflash unit comprising a horizontal linear array of flashlamps enclosed within a one-piece housing member having a light-transmitting front portion folded over a back portion containing a plurality of lamp-receiving cavities in which respective lamps are disposed. The housing is a formed sheet of plastic film having a linear fold disposed horizontally along the top of the array of cavities, which are selectively aluminized to provide a reflective coating on the cavity surfaces. A pair of lead-in wires from each of the lamps are connected to conductive circuit patterns on one side of a printed circuit board sandwiched between a set of tabs which run along the bottom of the front and back portions of the housing and are secured together. The sides of the housing are also secured so that the lamps, lead-in wires and connections are disposed within a secured enclosure, with a plurality of conductive connector terminals being disposed on a tab which projects from the printed circuit board and extends exteriorly of the secured enclosure.

23 Claims, 7 Drawing Figures

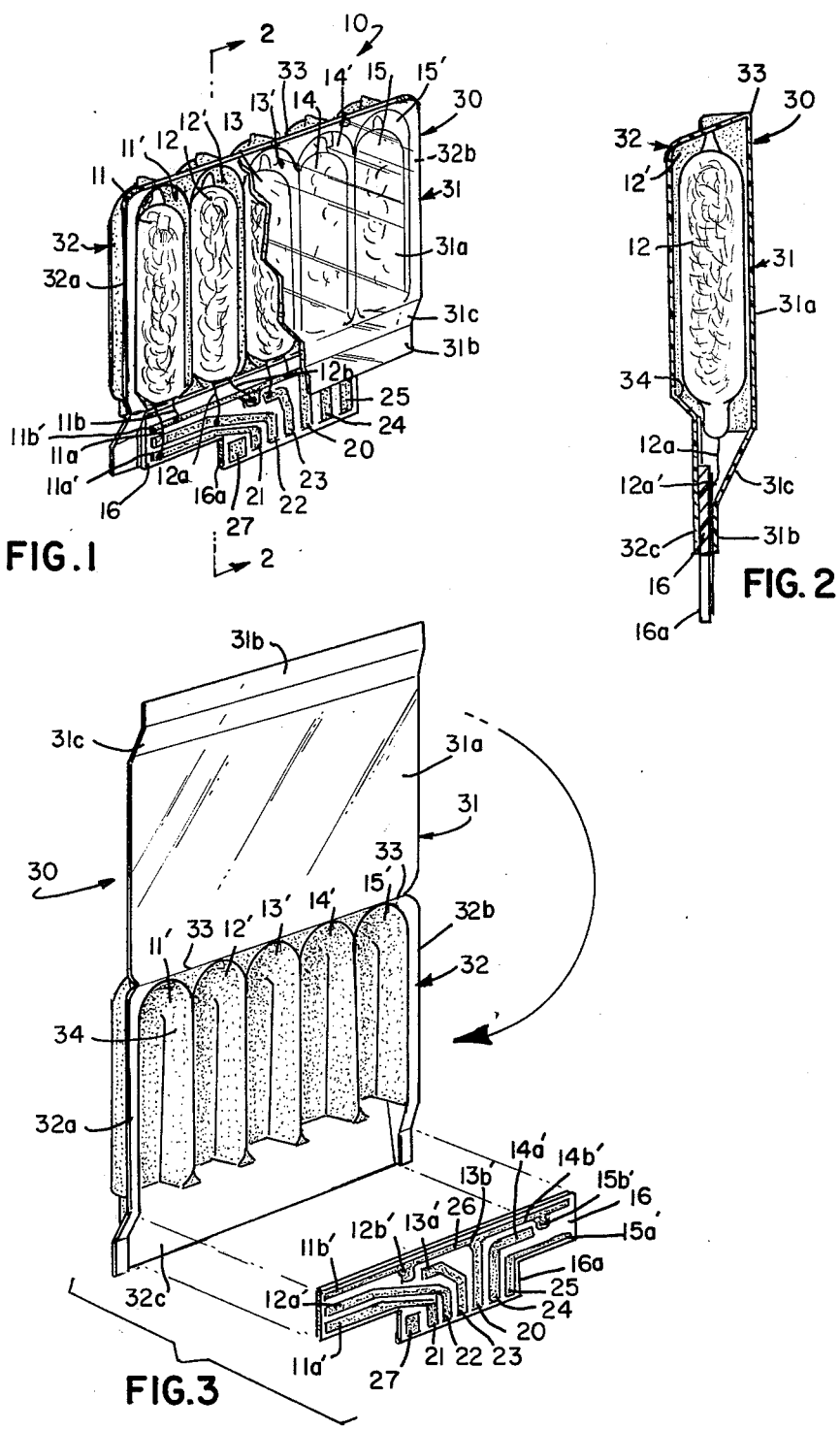

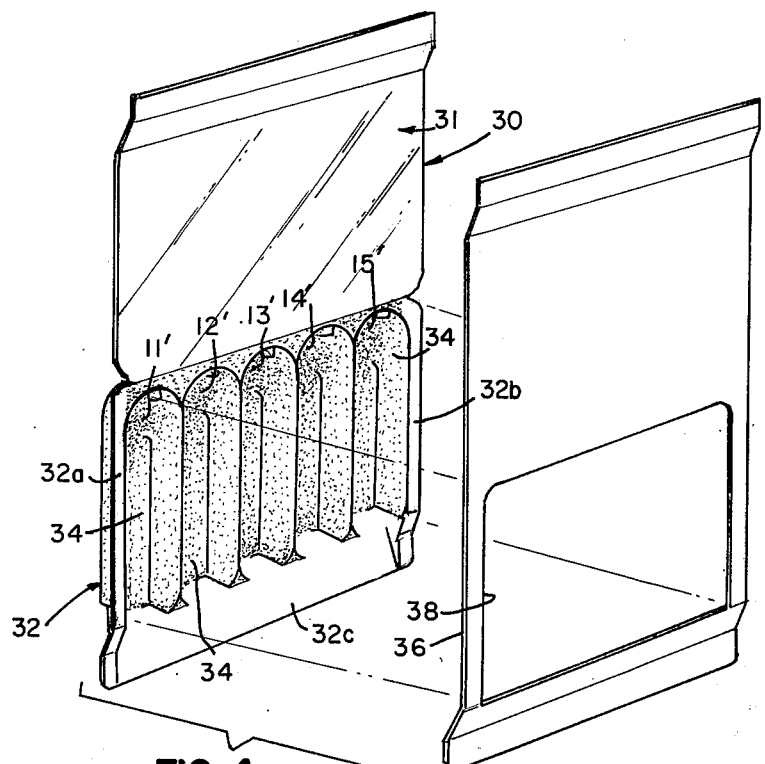
FIG. 4
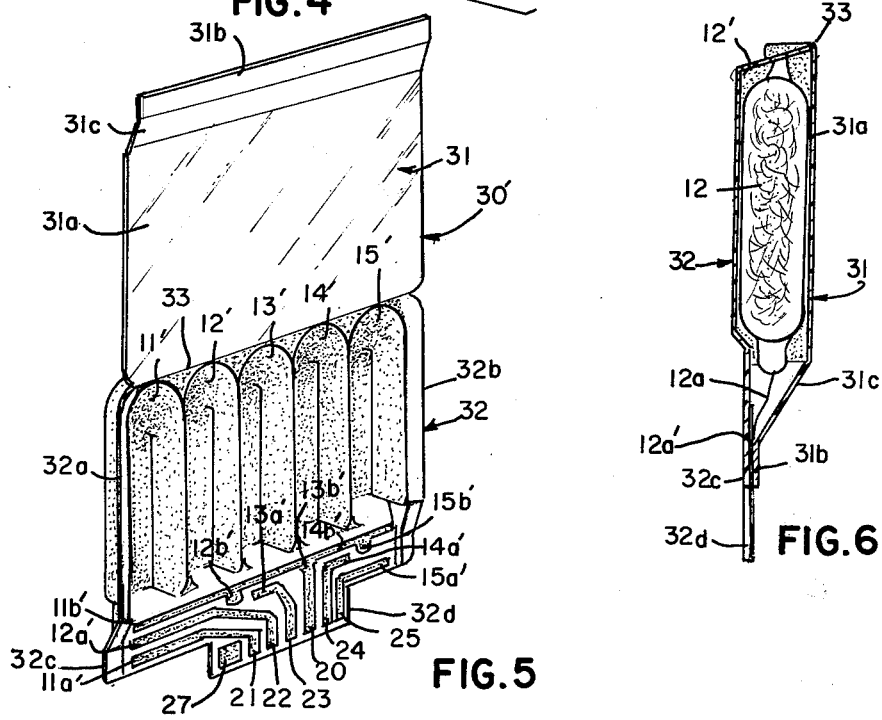
FIG. 5
FIG. 6

MULTILAMP PHOTOFLASH UNIT

BACKGROUND OF THE INVENTION

This invention relates to multilamp photoflash units and, in particular, to a more compact, cost-efficient array of photoflash lamps, having a housing with enhanced containment strength.

Heretofore, multilamp photoflash units, of either the cube or array configurations, have comprised at least two separate housing sections joined together. For example, in the case of the flashcube, such as described in U.S. Pat. No. 3,327,105, the magicube, such as described in U.S. Pat. No. 3,730,669, and the flash bar, such as described in U.S. Pat. No. 3,857,667, a plurality of lamps and associated reflectors are mounted on a relatively horizontal base member and enclosed in a cubical or rectangular parallelopiped-shaped transparent cover section which is joined to the periphery of the base section by means of heat or sonic sealing techniques. In the case of the flash bar, which is a bi-directional linear array, the lamps are connected to a printed circuit board which is held in the separate base member.

In a unidirectional linear photoflash array described in U.S. Pat. No. 3,473,880 of Wick, the lamps are connected to a printed circuit board which comprises the rear housing of the unit and includes reflector cavities. A separate transparent sheet is then secured to the front of the Wick unit to enclose the lamps. Circuit patterns and terminals are disposed on both sides of this rear housing member, and one of the lamp lead-in wires passes through an aperature in the rear housing reflector cavity for connection to a circuit pattern on the exterior of the rear side of the housing. U.S. Pat. No. 3,430,545 of Wick appears to illustrate a somewhat similar type of housing structure.

U.S. Pat. Nos. 3,894,226 and 4,017,728 illustrates a currently marketed planar photoflash array referred to as a flip flash. The overall construction of the flip flash unit comprises front and back plastic housing members with interlocking means for providing a unitary structure. The front housing member is a rectangular concavity, and the back housing is substantially flat. Sandwiched between the front and back housing members, in the order named, are a plurality of flashlamps, a multi-cavity reflector member, an insulating sheet, a printed circuit board having conductive patterns on one side to which the lamps are connected, and an indicia sheet. A similar planar array in which additional lamps are packaged in the same volume is described in U.S. Pat. No. 4,164,007.

Another planar array of photoflash lamps is described in U.S. Pat. No. 3,608,451 of Kelem, which illustrates an unenclosed circuit board having a connector tab at the bottom edge and a plurality of lamps connected to a conductive pattern which includes a flat reflector foil disposed on the surface of the circuit board. There is no enclosure housing shown in Kelem. U.S. Pat. No. 3,598,985, in FIG. 6, illustrates a combined reflector circuit board arrangement which is bidirectional and has an undulating reflector configuration. FIGS. 7 and 8 of the last-mentioned patent illustrate a folded terminal board reflector combination to provide a bidirectional configuration, the fold line being located along the center of the connector tab. The housing for the embodiments shown in U.S. Pat. No. 3,598,985 comprises a base section and a separate transparent cover section, similar to that described above with respect to the flash bar.

In U.S. Pat. No. 4,245,280 a compact, cost-efficient photoflash unit is described comprising a vertical linear array of flash lamps mounted on a printed circuit strip disposed within a longitudinal channel of an elongated rear housing member. A separate transparent cover panel is attached to the front of the housing member for enclosing the flash lamps. To provide structural rigidity, the cover has rectangular corner posts at each end and a transverse web at the center which engage slots in the housing and are secured by ultrasonic welding. The longitudinal edges are secured by a plurality of cylindrical posts along each side of the cover which fit into matching holes in the housing and have rivet heads formed in the ends as provided by ultrasonic heating and pressure.

SUMMARY OF THE INVENTION

Accordingly, it is an object of the present invention to provide an improved multilamp photoflash unit having a simplified, more cost-efficient construction which is compact and provides significantly improved containment and strength.

A principal object is to provide a multilamp array having a low per lamp cost and having an improved housing construction which is comparatively simple, easy to manufacture and of enhanced structural integrity.

These and other objects, advantages and features are attained in a photoflash unit comprising a one-piece housing member having a light-transmitting front portion folded over a back portion containing a plurality of lamp-receiving cavities. Each of a plurality of flashlamps are disposed in a respective one of the cavities and enclosed by the folded-over housing member, and a terminal means is joined to the housing member and coupled to the lamps for enabling flashing of the lamps in response to flash actuation signals applied thereto.

Preferably the housing member comprises a formed sheet of plastic film with lamp-receiving cavities formed in the back portion and disposed in a horizontal array. A linear fold separates the front and back portions of the housing member and is disposed horizontally along the top thereof, and means, such as adhesive, is provided for securing the front portion to the back portion along the sides and bottom of the folded-over housing member, thereby providing a secured enclosure about the lamps. A coating of reflective material is disposed on the surfaces of the lamp-receiving cavities which face the lamps, and preferably this coating is provided by selective metallization of the housing member whereby a reflective metallic coating is disposed on all the lamp-facing surfaces of the cavities, with the front portion of the housing and the secured regions along the sides and bottom of the back portion of the housing being free of the metallic coating.

According to one embodiment of the invention, the terminal means for the unit comprises a circuit board having electrically conductive circuit patterns disposed on a surface thereof which include a plurality of terminal areas at one side edge of the circuit board having that are selectively interconnected with a plurality of lamp contact areas. Each of the lamps has a pair of lead-in wires secured in electrical connection with respective ones of the lamp contact areas, and the side edge of the circuit board having the terminal areas extend below the folded-over housing member. All of the terminal areas and lamp contact areas connected to the lead-in wires are disposed on the same one side of the circuit board. In this manner there is no need for eyelets or through-the-board connections, and the lamp lead-in wires may be connected directly to the contact areas within the enclosure and not be required to pass through apertures at the rear of the housing reflector cavities. The circuit board has a substantial rectangular shape with a projecting tab on one side along which the terminal areas are located adjacent to one another. According to one variation, the circuit board tab is significantly narrower than the longer side of the board, and in yet another embodiment, the tab is wider than the circuit board.

In a specific embodiment, the back portion of the plastic housing member includes a first tab means which extends below the lamp-receiving cavities, and the front portion of the housing includes a window area adjacent the lamps and a second tab means which extends below the window area. When the sides and bottom of the folded-over housing are secured, a portion of the circuit board is sandwiched between and secured to the first and second tab means of the housing, with the projecting tab from the circuit board extending below and exteriorly of the secured enclosure.

According to another embodiment, the circuitry is made integral with the housing, and there is no need for a separate printed circuit board component. More specifically, the terminal means comprises electrically conductive circuit patterns disposed on a surface of the first tab means on the rear portion of the housing. The lamp lead-in wires are then secured in electrical connection with respective ones of lamp contact areas on that first tab means within the housing enclosure. The bottom edge of the first tab means at the rear of the housing has terminal areas which extend below the front portion of the folded over housing member, and all of these terminal areas and lamp contact areas connected to the lead-in wires are in the same one side of the first tab means of the housing.

The top and side peripheries of each of the lamp-receiving cavities are substantially in abutment with the front window area of the folded over front portion of the housing, whereby individual chambers are formed for enclosing each of the lamps. An opening at the bottom at each of the individual chambers provides means through which the lamp lead-in wires may pass to be connected to the selective lamp firing circuitry within the housing enclosure.

It has been found that the use of a single formed part for the housing in which the face is folded over the reflector section, provides a number of advantages. The overall height of the array is reduced by eliminating a sealing lip at the top of the unit. This also reduces the amount of plastic required for the package. The presence of a fold improves the longitudinal rigidity of the product, and it has also been found that the strength of the housing is significantly improved through use of a fold rather than a seal along the top edge of the array. Manufacturing economies are also attained, as the use of a single-piece housing obviates the need for individual handling of separate housing sections which are to be joined later in the assembly process.

BRIEF DESCRIPTION OF THE DRAWINGS

This invention will be more fully described hereinafter in conjunction with the accompanying drawings, in which:

FIG. 1 is a perspective view of one embodiment of a multilamp photoflash unit in accordance with the invention, the view being shown partly broken away in section to more clearly illustrate the construction thereof;

FIG. 2 is an enlarged cross-sectional view of FIG. 1 taken on line 2—2 thereof;

FIG. 3 is a perspective view, in unfolded form, of the one-piece housing of the unit of FIG. 1 in exploded relation to the associated printed circuit board, without showing the attached lamps;

FIG. 4 is an exploded perspective view illustrating the unfolded housing in relation to a mask employed for providing selective metallization of the housing reflector cavity surfaces;

FIG. 5 is a perspective view, in unfolded form, of an alternative embodiment of the housing, wherein conductive circuit patterns are disposed integrally on a portion of the housing, the associated lamps not being shown;

FIG. 6 is a cross-sectional view of a photoflash unit employing the housing embodiment of FIG. 5.

DESCRIPTION OF PREFERRED EMBODIMENTS

Figure 7:
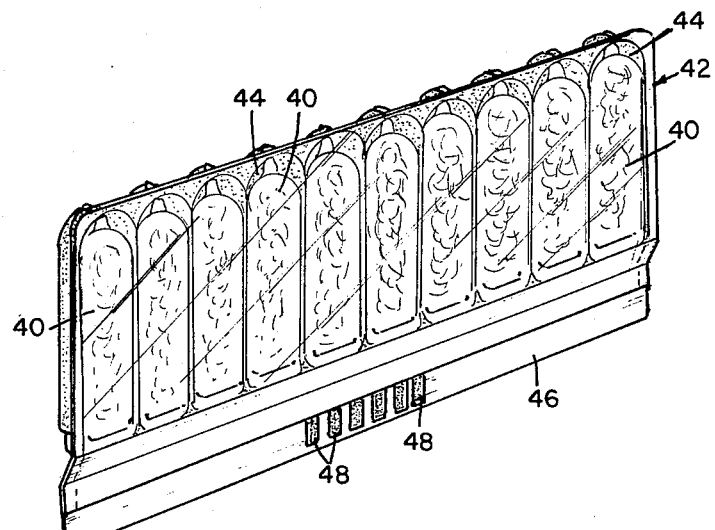
FIG. 7 is a perspective view of another embodiment of a multilamp photoflash unit in accordance with the invention.

FIGS. 1 and 2 illustrate one embodiment of a multilamp photoflash unit 10 comprising a horizontal array of five flash lamps 11–15 mounted on a printed circuit board 16. Each of the lamps has a pair of lead-in wires 11a, 11b, etc. connected to the printed circuitry on the board 16. For example, the lead-in wires 11a, 11b, etc., may be soldered to respective lamp contact areas 11a', 11b', etc. forming portions of conductive patterns on the circuit board 16 (see FIG. 3). Each of the lamps 11, etc., has a tubular light-transmitting glass envelope having a press seal at one end through which the lead-in wires emerge, and a tip-off at the other end. The exterior of the envelope is coated with a transparent protective material, such as cellulose acetate lacquer, and the interior is filled with a quantity of filamentary combustible material, such as shredded zirconium, and a combustion supporting gas, such as oxygen. The ignition means within the lamp envelope may comprise, in the case of a low voltage source, a filament connected across the inner ends of the lead-in wires with beads of primer material disposed about the junction of the lead-in wires and the filament.

When the flashlamps are mounted and positioned on the circuit board 16, the lead-in wires 11a, 11b, etc. are bent as illustrated, so that at all of the tubular envelopes of the lamps are positioned with the longitudinal axes thereof lying in a plane which is offset from but substantially parallel to the surface of the printed circuit board 16 and arranged in a horizontal array, as illustrated.

Referring also to FIG. 3, the circuit board 16 has a "printed circuit" thereon for enabling selective flashing of the lamps in response to flash actuation signals in the form of applied firing voltage pulses. In the particular embodiment illustrated in FIGS. 1–3, the entire printed circuit is provided on the same one side of the circuit board, namely, the obverse side of the board to which the flashlamp lead-in wires are connected. The substrate of circuit board 16 comprises an insulating material, such as XP phenolic, and the pattern of electrically conductive circuit runs is provided on the board surface by means such as silk screening, chemical etching, etc.

According to a preferred embodiment, however, the circuit patterns are formed of die-stamped copper, thereby providing significant cost advantages. For example, U.S. Pat. No. 3,990,142 describes a die-stamped printed circuit board, and copending applications Ser. Nos. 131,614 and 131,711, both filed Mar. 19, 1980 and assigned to the present assignee, described die-stamped circuit boards for photoflash devices.

The circuit board 16 has a substantially rectangular shape with a projecting tab 16a which is significantly narrower than the long lower side of the circuit board from which the tab projects. Located adjacent to one another on the tab are a plurality of terminal areas 20–25 at one side edge thereof which are selectively interconnected via conductor runs with a plurality of lamp contact areas 11a', 11b' through 15a', 15b'. More specifically, the terminal 20 forms part of, and is connected to, a common circuit conductor run 26 which is connected electrically to one lead-in wire of each of the flashlamps at lamp contact areas 11b'–15b', respectively. The terminals 21–25 are each directly connected to a respective one of the non-common lead-in wires of a respective one of the lamps. That is, selective terminal 21 is directly connected to the lamp contact area 11a'; selective terminal 22 is directly connected to lamp contact area 12a'; selective terminal 23 is directly connected to lamp contact area 13a'; selective terminal 24 is directly connected to lamp contact area 14a'; and the selective terminal 25 is directly connected to lamp contact area 15a'.

The common terminal 20 and the five selective terminals 21–25 on tab 16a are adapted for engagement with the socket contacts of a source of lamp firing pulses. For example, the source of firing pulses for connection to these terminals may comprise an electronic circuit such as that described in U.S. Pat. No. 3,618,492, which may be incorporated in a camera or a flash attachment for use with the camera and adapted to generate low voltage pulses in synchronization with the actuation of a camera shutter mechanism. Also shown on tab 16a is a conductive strip 27 for bridging camera socket contacts to convert the camera to a flash mode of operation, as described in U.S. Pat. No. 3,757,643.

In accordance with the invention, the lamp assembly and a portion of the circuit board are enclosed in a comparatively simple and compact housing construction of a cost-efficient and universal design. More specifically, the unit enclosure comprises a one-piece housing member 30 having a light-transmitting front portion 31 folded over a back portion 32 containing a plurality of, in this case five, lamp-receiving cavities 11'–15'. Preferably the housing member comprises a formed sheet of plastic film, such as cellulose propionate having a thickness of about 30 mils, prepared by injection molding, thermoforming of plastic sheet or film, or any other suitable means. As best shown in the unfolded illustration of FIG. 3, the housing member contains a linear fold 33 which separates the front and back portions, and when the housing is folded over, this linear fold 33 is disposed horizontally along the top of the horizontal array of lamp-receiving cavities 11'–15'.

In order to facilitate securing of the housing once it is folded over, the back portion 32 is provided with side flanges 32a and 32b, which extend on each side of the array of cavities, and an elongated tab 32c (FIG. 3) which extends below the array of cavities. The front portion 31 of the housing includes a transparent window area 31a, which is substantially planar, and an elongated tab 31b which extends below the window area and is disposed in a plane which is substantially parallel to but offset from the plane of the window area. The front portion 31 further includes a web 31c which joins window area 31a with the tab 31b.

In assembly of the unit, the lead-in wires of the flashlamps are soldered to the appropriate lamp contact areas on the printed circuit board 16, and then the circuit board is aligned against tab 32c of the housing, with each of the lamps 11–15 disposed in a respective one of the cavities 11'–15'. The front portion of the housing is then folded over, with the circuit board 16 sandwiched between tabs 31b and 32c and the window area 31a enclosing the lamps in their respective cavities. In this manner, the window area is essentially adjacent to the lamps and the top and side peripheries of the lamp receiving cavities are substantially in abutment with the window area of the folded over front portion so that individual chambers enclose each of the lamps. The bottom of each such chamber has an opening, as illustrated, through which each pair of lamp lead-in wires pass through to their electrical connection areas on the circuit board. In this manner, as is best illustrated in FIG. 2, the housing web 31c encloses the lamp lead-in wires and the contact areas on the circuit board to which the wires are connected. The sides and bottom of the housing are then secured, such as by use of an adhesive. More specifically, the back housing side flanges 32a and 32b align with the side portions of the front window area 31a such that an adhesive or other securing means may be disposed therebetween. As illustrated, the side flanges 32a and 32b may extend from the top to the bottom of the back portion of the unit, following the offset between the front periphery of the cavities and tab 32c, and thereby align with each full side of the front portion of the housing. That is, flanges 32a and 32b align with respective sides of the window area 31a, the web 31c, and the tab 31b. At the bottom, tabs 32c and 31b are secured to each side of the circuit board, such as by an adhesive.

In order to facilitate engagement of the terminal areas 20–25 with the socket contacts of a source of lamp firing pulses, such as a camera or flash attachment, the projecting tab 16a of the circuit board extends below and exteriorly of the secured housing enclosure, as shown in FIGS. 1 and 2, to expose these terminal areas.

In accordance with another aspect of the invention, as illustrated in FIG. 4, the surfaces of the lamp-receiving cavities 11'–15' which face the lamps are provided with a coating 34 of reflective material by means of selective metallization of the housing member. In this process, a metal sheet or other suitable material, is shaped to conform to the unfolded housing 30, thereby forming a shield or mask 36 that prevents the disposition of metallic vapor on the housing front portion 31, the side flanges 32a and 32b and the tab 32c, when placed in close proximity to the housing 30. The opening 38 cut out from the mask 36 allows the formation of a reflective surface only in the area of the reflective cavities 11'–15'. Typically, the reflector coating is provided by selectively aluminizing the housing cavities. In this manner, a reflective aluminum coating is disposed on the lamp facing surfaces of the cavities, with the front portion 31 of the housing and the secured regions 32a, 32b and 32c along the sides and bottom of the back portion of the housing being free of the aluminum coating.

The flash actuating circuitry functions as follows upon the terminals 20–25 being connected to a source of firing pulses, such as, for example, described in the aforementioned U.S. Pat. Nos. 3,618,492 and 3,757,643. Assuming that none of the lamps have been flashed, upon occurrence of a first firing pulse across terminals 20 and 21, this pulse will be directly applied to the lead-in wires of the first connected flashlamp 11, whereupon the lamp 11 flashes and becomes an open circuit between its lead-in wires 11a and 11b. In the electronic circuit described in the aforementioned U.S. Pat. No. 3,618,492, a monitoring function is provided wherein a current of limited predetermined maximum value is applied through each unexpended flashlamp. This monitoring current is generated prior to the ignition of a given one of the flashlamps. In this manner, alignment signals are derived which function to align the flashlamp sequencing circuit to bypass inoperative flashlamps. This monitoring function is dependent upon the resistance across the lamp lead-in wires. Thus, if the monitoring circuit senses a significantly higher resistance across the lamp lead-in wires, say for example, higher than 50 ohms, the selective terminal connected to that lamp will be bypassed, and the firing pulse will be applied across the operative lamp connected to the next successive selective terminal. On the other hand, if the monitoring circuit senses a resistance below the preselected level (that is below about 50 ohms) a firing pulse will be applied to the selective terminal connected to that lamp.

In the present instance, with the first lamp 11 having been fired, the monitoring circuit will cause the firing pulse alignment to bypass terminal 21 and proceed to terminal 22, to which the unexpended lamp 12 is directly connected. Hence, when the next firing pulse occurs, it is applied directly to the second lamp 12, thereby firing that lamp. In like manner the third firing pulse is applied via terminals 20 and 23 to fire lamp 13. The fourth firing pulse is applied via terminals 20 and 24 to fire lamp 14 and the fifth firing pulse supplied via terminals 20 and 25 to fire lamp 15. As each lamp flashes, the reflective metalized coating 34 causes the flash illumination to be directed in front of the array.

We have found that the use of a single formed part, namely, housing 30, in which the front portion including window area 31a is folded over the back portion including the reflector cavities 11'-15', provides a number of advantages. The overall height of the array is reduced by eliminating a sealing lip across the top of the unit, which in turn reduces the amount of plastic required for the package. The presence of the fold 33 improves the longitudinal rigidity of the product. It has also been found that the strength of the housing is significantly improved through the use of a fold 33 rather than a butt seal, or the like, along the top edge of the photoflash unit.

According to an alternative embodiment which provides yet further simplification of the photoflash package, the flash actuation circuitry is made integral with the one-piece housing, as illustrated in FIGS. 5 and 6. More specifically, the electrically conductive circuit patterns comprising the terminal areas 20–25 and the selectively interconnected lamp contact areas 11a', 11b', etc. are disposed directly on a surface of the housing tab 32c which extends below the housing cavities 11'-15'.

In a preferred embodiment, die-stamped copper circuitry is applied to this depending tab of the formed plastic housing. In order to facilitate exposure of the terminal areas 20–25 for connection to the socket of a source of lamp-firing pulses, the back portion of the housing 30' is modified to include a projecting tab 32d at the bottom edge of the tab 32c, tab 32d being significantly narrower than tab 32c. As illustrated, the terminal areas 20–25 are located adjacent one another on the projecting tab 32d.

During assembly of the photoflash unit embodiment of FIGS. 5 and 6, the lamps 11–15 are disposed in the respective cavities 11'-15' and each pair of lamp lead-in wires 11a, 11b, etc., are soldered to the respective lamp contact areas 11a', 11b', etc. on the depending plastic tab 32c. The front portion 31 of the housing 30' is then folded over and secured at the side flanges 32a and 32b. Along the bottom portion of the unit, the tab 31b of the front portion of the housing is secured, such as by adhesive, to a portion of the tab 32c on the back portion of the housing. All of the conductive patterns and the lamp lead wire connections are on the same one side of the tab 32c, namely, on the front, or cavity side. Hence, when the bottom of the housing is secured, a portion of the conductive circuit patterns is sandwiched between the secured tabs 31b and 32c, and the projecting tab 32d extends below and exteriorly the secured enclosure, as best shown on FIG. 6. As described with respect to the embodiment of FIGS. 1 and 2, all of the lamps, lead-in wires and lamp contact areas are disposed within the secured enclosure formed by the rear housing cavities 11'-15', the window area 31a and the web 31c. Although the described embodiments have referred to the use of five lamps in a horizontal linear array which is unidirectional and employs a relatively narrow connecting tab, it is contemplated that the construction may be applied to an array of two or more lamps which may be disposed for bidirectional applications in an arrangement that is other than linear and employs a connecting tab which is as wide or wider than the printed circuit board or tab 32c. Thus, for example, FIG. 7 illustrates a specific alternative embodiment which employs ten lamps 40 disposed in a horizontal linear array in a one-piece housing 42 having a back portion with reflector cavities 44 facing unidirectionally. Other than for employing ten cavities and having somewhat different overall dimensions, the housing 42 is essentially the same as the housing 30 described with respect to FIGS. 1–3. The photoflash unit of FIG. 7 employs a printed circuit board having a projecting tab 46 which is actually wider than the main portion of the circuit board. Disposed on the circuit board tab 46 are a plurality of conductive terminal areas 48 which extend below and exteriorly of the secured housing enclosure. If, as illustrated, five selective terminals and a common terminal are employed to control the firing of ten lamps, selective switching circuitry may be employed for respective lamp pairs, as described in copending applications Ser. Nos. 156,983 and 156,991, both filed June 6, 1980 and assigned to the present assignee. The lamps are assembled to the circuit board and the circuit board is enclosed and secured within the housing 42 in the same manner described with respect to the embodiment of FIGS. 1 and 2.

Hence, although the invention has been described with respect to a specific embodiment, it will be appreciated that modifications and changes may be made by those skilled in the art without departing from the true spirit and scope of the invention. For example, the housing 30, may be formed of materials other than cellulose propionate, such as other thermoplastic films; the circuit board may be formed of a material other than phenolic, such as enamel coated steel or polystyrene; the reflective coating may be other than aluminum; and in some applications, it may be found unnecessary to provide a metalized coating on the surfaces of the lamp-receiving cavities. Further, it will be appreciated that conductive materials other than copper may be employed for providing the circuit patterns.

We claim:

1. A multilamp photoflash unit comprising, in combination, a one-piece housing member having a light-transmitting front portion folded over a back portion containing a plurality of lamp-receiving cavities, a plurality of flashlamps each disposed in a respective one of said cavities and enclosed by said folded-over housing member, and terminal means joined to said housing member and coupled to said lamps for enabling flashing of the lamps in response to flash actuation signals applied to said terminal means.

2. The photoflash unit of claim 1 wherein said housing member comprises a formed sheet of plastic film with said lamp-receiving cavities formed in said back portion.

3. The photoflash unit of claim 2 wherein said housing member contains a linear fold separating said front and back portions.

4. The photoflash unit of claim 3 wherein said lamp-receiving cavities are disposed in a horizontal linear array, and said linear fold is disposed horizontally along the top of said array of cavities.

5. The photoflash unit of claim 1 wherein said housing member contains a linear fold separating said front and back portions and disposed horizontally along the top of said housing member, and further including respective means securing said front portion to said back portion along the sides and bottom of said folded over housing member, thereby providing a secured enclosure about said lamps.

6. The photoflash unit of claim 5 wherein said terminal means extend below and exteriorly of said secured enclosure.

7. The photoflash unit of claim 6 wherein each of said lamps has a pair of lead-in wires secured in electrical connection with respective portions of said terminal means within said secured enclosure.

8. The photoflash unit of claim 1 wherein a coating of reflective material is disposed on the surfaces of said lamp-receiving cavities which face said lamps.

9. The photoflash unit of claim 8 wherein said housing member contains a linear fold separating said front and back portions and disposed horizontally along the top of said housing member, and further including respective means securing said front portion to said back portion along the sides and bottom of said folded over housing member, and wherein said coating of reflective material is selectively disposed on said housing member whereby a reflective coating is disposed on all lamp-facing surfaces of said cavities, with said front portion and the secured regions along the sides and bottom of said back portion being free of said reflective coating.

10. The photoflash unit of claim 1 wherein said terminal means comprises a circuit board having electrically conductive circuit patterns disposed on a surface thereof, said circuit patterns including a plurality of terminal areas at one side edge of said circuit board that are selectively interconnected with a plurality of lamp contact areas, each of said lamps has a pair of lead-in wires secured in electrical connection with respective ones of said lamp contact areas, said side edge of the circuit board having said terminal areas extends below said folded-over housing member, and all of said terminal areas and said lamp contact areas connected to said lead-in wires are disposed on the same one side of said circuit board.

11. The photoflash unit of claim 10 wherein said circuit board has a substantially rectangular shape with a projecting tab at a longer side thereof, said tab being significantly narrower than said longer side of the circuit board from which said tab projects, and said terminal areas are located adjacent one another on said tab.

12. The photoflash unit of claim 10 wherein said circuit board has a substantially rectangular shape with a projecting tab at a longer side thereof, said tab being wider than the longer side of the circuit board from which said tab projects, and said terminal means are located adjacent one another on said tab.

13. The photoflash unit of claim 10 wherein said housing member contains a linear fold separating said front and back portions and disposed horizontally along the top of said housing member, said back portion of the housing member includes a first tab means extending below said cavities, said front portion of the housing member includes a window area adjacent said lamps and a second tab means extending below said window area, said circuit board has a projecting tab at said one side edge with said terminal areas located adjacent one another on said circuit board tab, and further including respective means securing said front portion to said back portion along the sides and bottom of said folded over housing member, thereby providing a secured enclosure about said lamps, a portion of said circuit board being sandwiched between and secured to said first and second tab means of the housing member with said circuit board tab extending below and exteriorly of said secured enclosure.

14. The photoflash unit of claim 13 wherein said lamp lead-in wires and lamp contact areas are disposed within said secured enclosure.

15. The photoflash unit of claim 14 wherein said window area and second tab means of the front portion of the housing member are disposed in substantially parallel planes offset from one another, and said front portion further includes a web joining said window area and second tab means, said web enclosing said lead-in wires.

16. The photoflash unit of claim 1 wherein said housing member contains a linear fold separating said front and back portions and disposed horizontally along the top of said housing member, said back portion of said housing member includes a first tab means extending below said cavities along substantially the full width of said back portion, said terminal means comprises electrically conductive circuit patterns disposed on a surface of said first tab means, said circuit patterns including a plurality of terminal areas at one side edge of said first tab means that are selectively interconnected with a plurality of lamp contact areas, each of said lamps has a pair of lead-in wires secured in electrical connection with respective ones of said lamp contact areas, said side edge of the first tab means having said terminal areas extending below the front portion of said folded-over housing member, and all of said terminal areas and said lamp contact areas connected to said lead-in wires are on the same one side of said first tab means.

17. The photoflash unit of claim 16 wherein said first tab means has a projecting tab at the bottom edge thereof, said projecting tab being significantly narrower than said first tab means, and said terminal areas are located adjacent one another on said projecting tab.

18. The photoflash unit of claim 16 wherein said first tab means has a projecting tab at the bottom edge thereof, said projecting tab being wider than said first tab means, and said terminal areas are located adjacent one aother on said projecting tab.

19. The photoflash unit of claim 16 wherein said front portion of the housing member includes a window area adjacent said lamps and a second tab means extending below said window area, said first tab means has a projecting tab at said one side edge with said terminal areas located adjacent one another on said projecting tab, and further including respective means securing said front portion to said back portion along the sides and bottom of said folded-over housing member, thereby providing a secured enclosure about said lamps, a portion of said conductive circuit patterns being sandwiched between said secured first and second tab means of the housing member with said projecting tab extending below and exteriorly of said secured enclosure.

20. The photoflash unit of claim 19 wherein said lamp lead-in wires and lamp contact areas are disposed within said secured enclosure.

21. The photoflash unit of claim 20 wherein said window area and second tab means of the front portion of the housing member are disposed in substantially parallel planes offset from one another, and said front portion further includes a web joining said window area and second tab means, said web enclosing said lead-in wires.

22. The photoflash unit of claim 1 wherein said housing member contains a linear fold separating said front and back portions and disposed horizontally along the top of said housing member, said front portion of the housing member includes a substantially planar window area adjacent said lamps, and the top and side peripheries of said lamp-receiving cavities are substantially in abutment with the window area of said folded over front portion, whereby an individual chamber encloses each of said lamps.

23. The photoflash unit of claim 22 further including respective means securing said front portion to said back portion along the sides and bottom of said folded-over housing member, thereby providing a secured enclosure about said lamps, and wherein each of said lamps has a pair of lead-in wires secured in electrical connection with respective portions of said terminal means within said secured enclosure, each pair of lead-in wires passing through an opening at the bottom of the individual chamber enclosing the lamp from which the wires emerge.

* * * * *

UNITED STATES PATENT AND TRADEMARK OFFICE
CERTIFICATE OF CORRECTION

PATENT NO. : 4,326,241
DATED : April 20, 1982
INVENTOR(S) : DAVID R. BROADT; DONALD W. HARTMAN; JOHN W. SHAFFER AND EMERY G. AUDESSE It is certified that error appears in the above-identified patent and that said Letters Patent are hereby corrected as shown below:

Column 1, Line 7, delete "ahousing" and insert (-a housing-)

Column 1, Line 33, delete "aperature" and insert (-aperture-)

Column 1, Line 38, delete "illustrates" and insert (-illustrate-)

Column 2, Line 35 delete "are" and insert (-is-)

Column 2, Line 62 delete "having"

Column 9, Line 38 delete "extend" and insert (-extends-)

Column 11, Line 7 delete "aother" and insert (-another-)

Signed and Sealed this

Fourteenth Day of September 1982

[SEAL]

Attest:

GERALD J. MOSSINGHOFF

Attesting Officer      Commissioner of Patents and Trademarks